United States Patent [19]
Scott

[11] Patent Number: 5,952,888
[45] Date of Patent: Sep. 14, 1999

[54] ROVING RANGE CONTROL TO LIMIT RECEIVE PLL FREQUENCY OF OPERATION

[75] Inventor: Paul H. Scott, San Jose, Calif.

[73] Assignee: Cypress Semiconductor Corp., San Jose, Calif.

[21] Appl. No.: 09/047,595

[22] Filed: Mar. 25, 1998

[51] Int. Cl.[6] .............................. H03L 7/07; H03L 7/087
[52] U.S. Cl. .................. 331/2; 331/11; 331/17; 331/23; 331/DIG. 2; 327/147; 375/376
[58] Field of Search .................. 331/2, 11, 14, 331/17, 18, 23, 25, DIG. 2; 327/147–150; 375/344, 376

[56] References Cited

U.S. PATENT DOCUMENTS

| | | | |
|---|---|---|---|
| 5,015,970 | 5/1991 | Williams et al. | 331/11 |
| 5,081,705 | 1/1992 | Swanke | 455/73 |

OTHER PUBLICATIONS

Cypress Data Communications Data Book, CY7B951 Local Area Network ATM Transceiver, 1996, pp. 3–1 to 3–8.
Cypress Data Communications Data Book, CY7B952 SONET/SDH Serial Transceiver, 1996, pp. 3–9 to 3–15.
Cypress Data Communications Data Book, CY7B923 CY7B933, Transmitter/Receiver, 1996, pp. 4–1 to 4–27.

Practical Data Communications by Roger L. Freeman, 1995, pp. 130 to 286; John Wiley & Sons, Inc.

Cypress CY7C955, AX™ ATM–SONET/SDH Transceiver, Jul. 1997, pp. 2 to 76.

*Primary Examiner*—David Mis
*Attorney, Agent, or Firm*—Christopher P. Maiorana, P.C.

[57] ABSTRACT

A circuit comprising a plurality of phase locked loop circuits, a control circuit and a plurality of storage elements. Each of the plurality of phase locked loop circuits may present a recovered data signal and a recovered clock signal in response to one of a plurality of serial data streams, a clock signal and one of a plurality of indication signals. The control circuit may present a counter signal in response to the recovered clock signals. The plurality of storage elements may each be configured to present one of the indication signals in response to the clock signal, a select signal and the counter signal.

17 Claims, 4 Drawing Sheets ps/2,888

ROVING RANGE CONTROL TO LIMIT RECEIVE PLL FREQUENCY OF OPERATION

FIELD OF THE INVENTION

The present invention relates to phase locked loops (PLLs) generally and, more particularly, to a roving range control to limit receive phase lock loop frequency of operation.

BACKGROUND OF THE INVENTION

Referring to FIG. 1, one type of conventional clock recovery phase locked loop circuit 10 is shown. The circuit 10 generally comprises a phase detector 12, a filter 14, and oscillator 16 and a decoding device 17. This type of phase locked loop is used to synchronize a clock frequency 26 with serial data 33 such that the data can be recovered correctly.

Serial data is presented to an input 24 of the phase detector 12. The phase detector 12 is generally coupled to the oscillator 16 through the filter 14. An output 26 of the oscillator 16 is presented to an input 30 of the phase detector 12 as well as to an input 31 of the decoding device 17. The decoding device 17 also has an input 33 that receives the serial data input. The circuit 10 is generally used to provide a properly timed clock (i.e., a clock at the same rate as the serial data, and with proper phase alignment to insure adequate time margins) to the decoding device 17.

A typical voltage controlled oscillator (VCO) has the capability to operate over a wide frequency range to (i) provide a flexible frequency of operation and (ii) accommodate process and environmental variations. A phase detector (PD) only corrects for a phase error and is insensitive to the frequency of operation of the PLL. This insensitivity is required since serial data consists of variable width pulses and variable width spaces. The transitions, when they occur, are at predictable intervals, but the data stream has no intrinsic operating frequency because of the nature of the serial data stream. It is difficult for a conventional PLL to correct for frequency error when decoding serial data. Edges generally occur at specific intervals of an input clock (i.e., the intrinsic operating frequency), but errors in clock rate can be misinterpreted as data running at another frequency.

One problem associated with the circuit 10 may occur when the VCO 16 operates at a harmonic (e.g., one half, twice, or other multiples) of the data rate of the serial data input. In such a case, the phase detector 12 will not try to correct the error, but will instead provide an out of tolerance clock to the decoder device 17. Another problem occurs when the frequency of oscillation of the signal at the output 26 is out of tolerance by a large amount.

One approach to remedying the problem associated with the VCO 16 operating at a harmonic of the serial data input is to limit the operating range of the VCO, as closely as possible to a small percentage around an expected data rate. In such a system a trimmed oscillator, or tuneable oscillator, may be used to provide such a correction. However, this solution is not desirable since it may introduce other problems, including manufacturing complexity and degrade product performance.

Referring to FIG. 2, another conventional phase locked loop circuit 10' is shown. This type of phase locked loop is generally used to multiply a reference frequency by some multiple set by a feedback divider. The circuit 10' generally substitutes a phase frequency detector 20 for the phase detector 12. The phase frequency detector 20 is generally coupled to the oscillator 16 through the filter 14. A divider circuit 18 has an input 28 that receives the output of the oscillator 16. The divider 18 generally presents a signal to the input 30 of the phase frequency detector 20. The phase frequency detector 20 is capable of indicating both phase error and frequency error. Errors coupled through the filter 14 cause the VCO 16 to change its frequency to minimize the error. VCO frequency errors are easily managed by the circuit 10'. The nominal frequency of operation will be the reference frequency multiplied by a divider ratio. A typical phase frequency detector 20 as used in phase locked loop 10' cannot tolerate irregular input data streams that may be found in a serial data input. As a result, the circuit 10' is not an adequate solution for the VCO frequency error problem.

Referring to FIG. 3, a circuit 40 is shown implementing phase locked loop circuit 10 with a "use local clock" input. The circuit 40 can be used for clock recovery in the same way as the circuit 10, and can correct for frequency errors in the same way as circuit 10'. The circuit 40 generally comprises a PLL 10 (which includes a phase detector (PD) 12, a filter 14, and an oscillator (VCO) 16), a VCO frequency divider 18, a phase frequency detector (PFD) 20 and a switch 22. Serial data is presented to an input 24 of the phase detector 12. The phase detector 12 is coupled to the oscillator 16 through the filter 14. An output 26 of the oscillator 16 is presented to an input 28 of the VCO frequency divider 18 as well as to a feedback received at an input 30 of the phase detector 12.

The VCO frequency divider 18 has an output 30 that presents a signal to an input 32 of the phase frequency detector (PFD) 20. An external reference frequency is presented to an input 34 of the phase frequency detector 20. An output 36 of the phase frequency detector 20 is presented to an input 38 of the switch 22, which also has an input 40 that receives the use local clock signal. The switch 22 presents a signal at an output 42 that is received at an input 44 of the filter 14. The filter 14 is constructed in such a way that when errors are coupled through the frequency error input 44, they will dominate the signal connected to the VCO 16. When the frequency of oscillation of the signal at the output 26 has a very large frequency error when compared with the external reference frequency, logic external to the PLL will assert the use local clock signal received at the input 40. This turns on the switch 22 which causes VCO corrections to be generated by the PFD 20, and to be presented to the input 44 of the filter 14. The use-local clock input 40 may be an internal or an external signal. The phase frequency detector 20 and other control logic can be powered down when not in use.

FIG. 4, illustrates a circuit 50 for triggering the input 44 causing the circuit of FIG. 3 to lock to a local clock. The circuit 50 includes a reference clock divider block (or circuit) 52, an out-of-lock indicator block (or circuit) 54, a terminal count block (or circuit) 56, and a VCO cycle counter 58. The circuit 50 continuously monitors the ratio of the VCO frequency to the reference frequency to switch in (or select) a phase frequency detector (i.e., PFD 20 of FIG. 3) when necessary to correct the VCO frequency during an out-of-range condition. The reference clock divider circuit 52 divides the reference clock frequency by a fixed number (i.e., 256) to produce a low frequency sampling rate. The VCO cycle counter 58 counts the VCO oscillator cycles for a predetermined time (e.g., a sampling period) to measure the exact frequency of oscillation of the signal received from the receive clock divider circuit 52. In one example, the VCO cycle counter 58 may be implemented as a counter 60 and a counter 62, which may present a number related to the ratio of the reference clock divider. During a particular sampling period while the output of the reference clock divider 52 is low, a predetermined number of VCO cycles may occur, indicating the VCO would be operating at the proper frequency. Otherwise, an error signal (e.g., MAX or MIN) is presented at the output 64 or 66 that indicates an over count or under count condition has occurred and the operating frequency is out of tolerance. The signal MAX is received at an input 68 of the terminal count circuit 56 and the signal MIN is received at the input 70 of the terminal count circuit 56. If either the input 68 or the input 70 receives the signal MAX or signal MIN, an out-of-range indication signal is presented at an output 72 to an input 74 of the out-of-lock indicator circuit 54.

The counter 58 is shown implemented as a two part counter. A low speed counter 60 is implemented for the high order bits and a high speed synchronous counter 62 (which is easily decoded) is implemented for the low order bits which may run at the VCO rate. The high order counter 60 provides a carry output to the low order counter 62 to produce a single counter 58. The counters 60 and 62 may be viewed as a single counter or as two counters operating in series.

During operation of the circuit 50, the reference clock divider circuit 52 is high for 128 cycles and low for a 128 cycles to produce a divide by 256 counter. The reference clock divider circuit 52 presents a signal (e.g., REFDIVOUT) that, when high, causes the counter 58 to be held to a preset value (e.g., 1021). When the signal REFDIVOUT is low, the VCO cycle counter 58 begins to count down from the preset value. An ideal value indicating a locked signal may be selected (e.g., 0003). When the counted value reaches at least 0006, and not less than 0000, before the signal REFDIVOUT rises, proper operation of the circuit occurs (i.e., operation within 0.3% of the correct frequency or +/−3/1024). In such a case the terminal count circuit does not present the out-of-range indication signal to the input 74 of the out-of-lock indicator circuit 54. If the counter 58 is not decremented to be at least 0006, or has reached 0000, then the VCO is "out-of-range" and the terminal count circuit 56 will present the out-of-lock indication signal at the input 74 of the out-of-lock indicator circuit 54.

The terminal count is set using the VCO as a clock so that the circuit 50 will be able to record the error in real time. The state of the overall out-of-lock indicator circuit 54 is preserved and can be used, when the circuit 56 (along with the VCO cycle counter) is reset. When the signal REFDIVOUT is high the VCO cycle counter 58 and the terminal count circuit 56 are reset and prepared for the next cycle of frequency comparison.

The out-of-lock indicator 54 is a clocked device that operates on the rising edge of the signal REFDIVOUT. If an error has been recorded, the out-of-lock indicator 54 causes the PLL to lock to the local clock. An arbitrary time later, the out-of-lock indicator 54 is cleared, which may allow the PLL to reacquire an incoming data stream. While the solution in FIG. 4 may provide internal range control for a single PLL system, in multiple PLL chips, a significant power and size burden may result by duplicating the various components of the circuit 50.

SUMMARY OF THE INVENTION

The present invention concerns a circuit comprising a plurality of phase locked loop circuits, a control circuit and a plurality of storage elements. Each of the plurality of phase locked loop circuits may present a recovered data signal and a recovered clock signal in response to one of a plurality of serial data streams, a clock signal and one of a plurality of indication signals. The control circuit may present a counter signal in response to the recovered clock signal. The plurality of storage elements may each be configured to present one of the indication signals in response to the clock signal, a select signal and the counter signal.

The objects, features and advantages of the present invention include providing a circuit that may be controlled by a single frequency-comparator/range-control circuit which may (i) sequentially manage the operation of multiple clock recovery PLLs, (ii) correct only PLLs that are operating outside of a predetermined acceptable range while not interfering with those that are within the predetermined acceptable range, (iii) force all of the PLLs to correct/center frequency at the same time and then manage them independently thereafter and (iv) cause one or more PLLs to correct/center frequency based on a frequency error condition and performance of the other PLLs in the system.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 5:
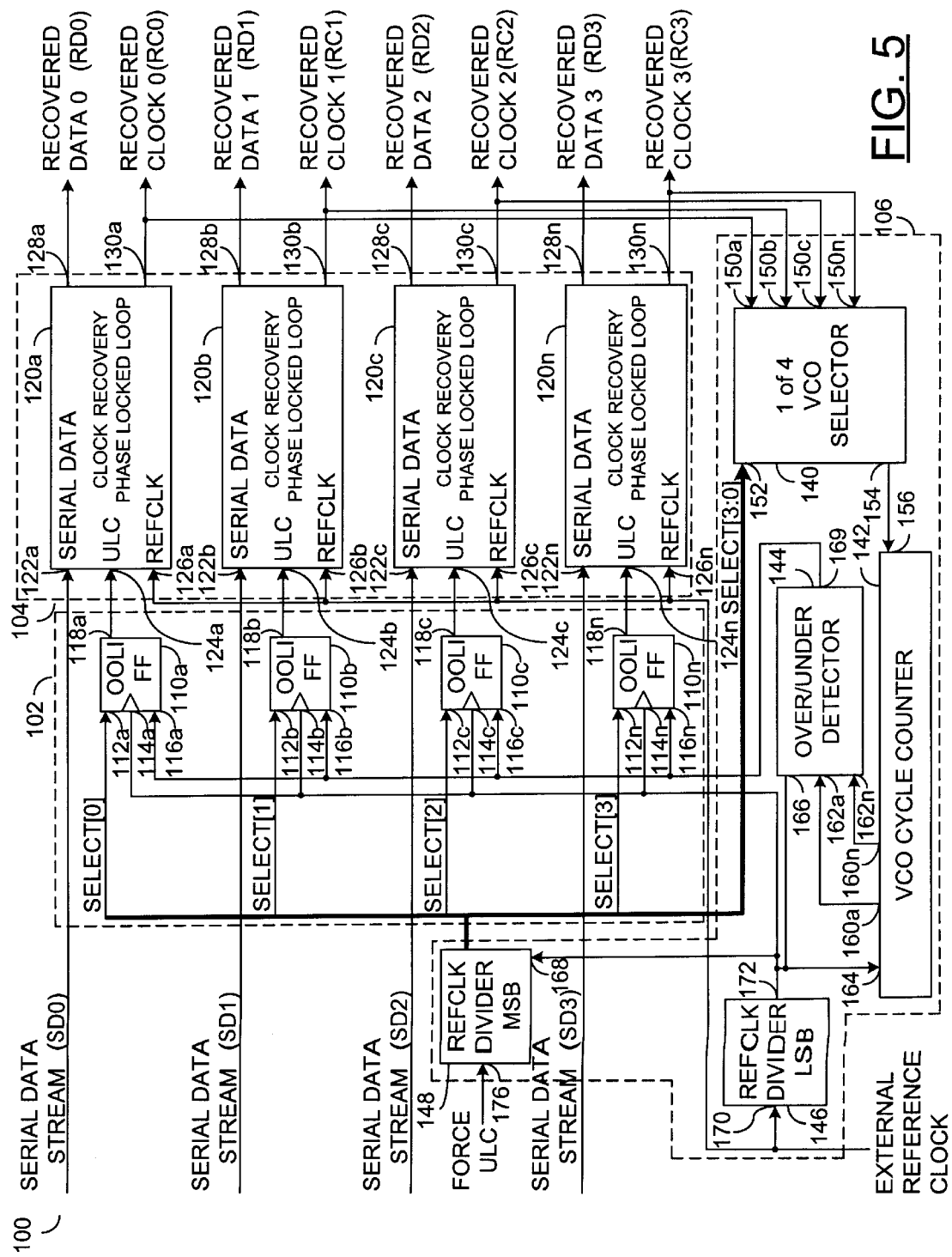
FIG. 5 is a diagram of a preferred embodiment of the present invention.

Referring to FIG. 5, a block diagram of a circuit 100 is shown in accordance with the preferred embodiment of the present invention. The circuit 100 generally comprises a storage section (or circuit) 102, a PLL section (or circuit) 104, and a counter/selector section (or circuit) 106. The storage section 102 generally comprises a number of storage elements (e.g., flip-flops) 110a–110n. Each of the storage elements 110a–110n generally comprises an input 112a–112n, an input 114a–114n, an input 116a–116n and an output 118a–118n.

The PLL section 104 generally comprises a number of phase locked loops (PLLs) 120a–120n. In one example, the PLLs 120a–120n may be implemented as clock recovery phase locked loops. Each of the PLLs 120a–120n has an input 122a–122n, an input 124a–124n, an input 126a–126n, an output 128a–128n and an output 130a–130n. The inputs 122a–122n generally receive serial data stream (e.g., SDO-SDN). The inputs 124a–124n generally receive an indication signal (e.g., a use local clock signal ULC) from outputs 118a–118n of the storage elements 110a–110n. The inputs 126a–126n generally receive an external reference clock (e.g., a signal REFCLK). The outputs 128a–128n generally present a recovered data signal (e.g., RDO-RDN). The outputs 130a–130n generally present a recovered clock signal (e.g., RCO-RCN).

Figure 1:
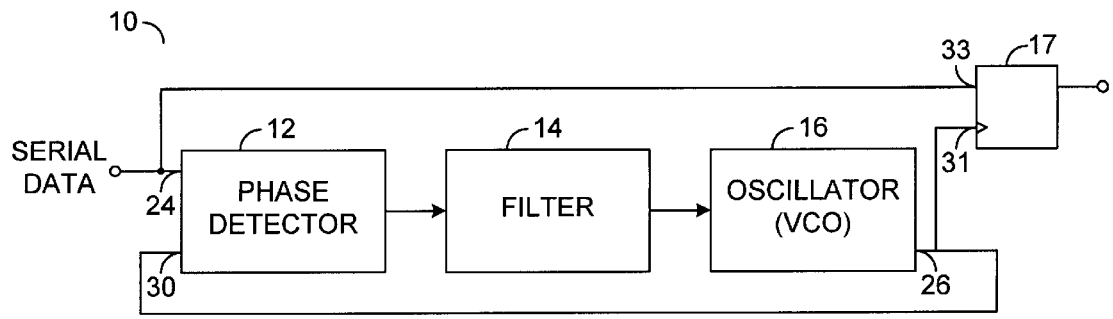
FIG. 1 is an example of one conventional approach to implementing a PLL.
Figure 2:
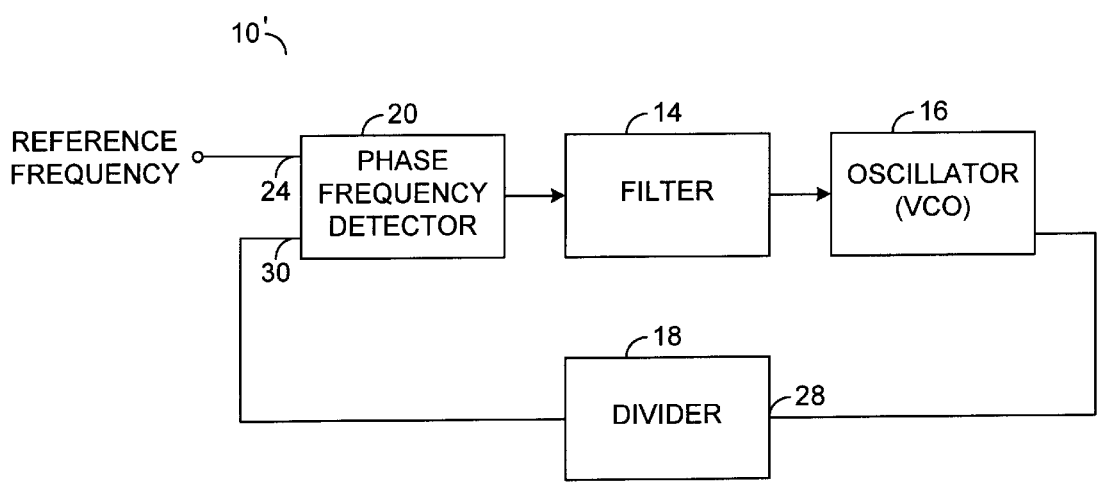
FIG. 2 is an example of another conventional approach to implementing a PLL.
Figure 3:
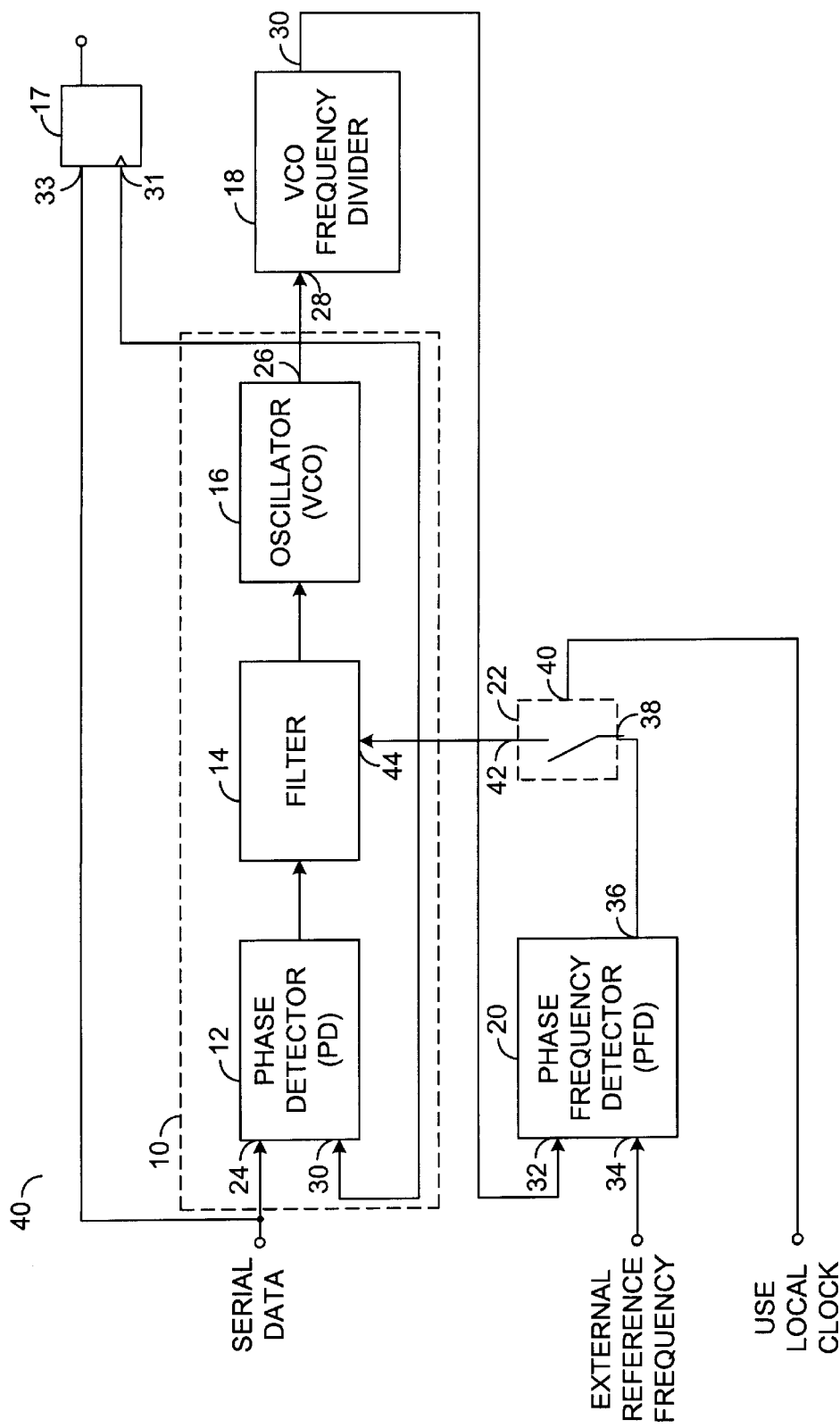
FIG. 3 is an example of an approach to implementing a PLL with a local clock injection point.
Figure 4:
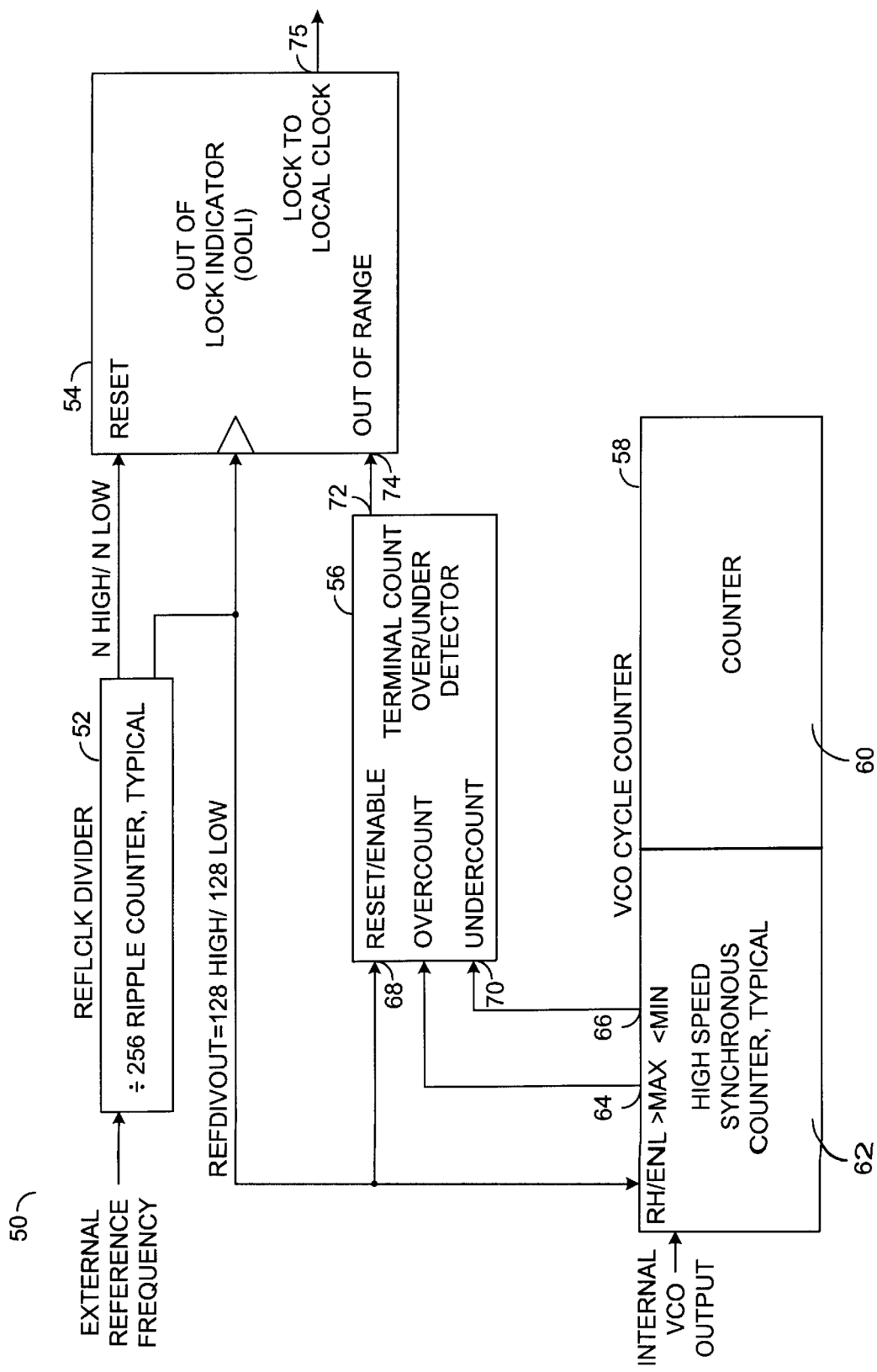
FIG. 4 is an example of an approach to implementing an injection point in a PLL.

The counter/selector circuit 106 generally comprises a VCO selector 140, a VCO cycle counter 142, an over/under detector 144, a reference clock divider block (or circuit 146) and a reference clock divider block (or circuit) 148. The VCO selector 140 comprises a number of inputs 150a–150n. The inputs 150a–150n generally receive the recovered clock signals RCO-RCN, respectively. The VCO selector 140 also comprises an input 152 that generally receives a multi-bit signal from the reference clock divider block 148. The multi-bit signal generally comprises a select signal (e.g., a select signal [0:n]) that may also be presented to the inputs 112a–112n of the storage elements 110a–110n. The VCO selector 140 also comprises an output 154 that may present a signal to an input 156 of the VCO cycle counter 142. The signal presented at the output 154 is generally one of the recovered clock signals RCO-RCN received at the inputs 150a–150n. The particular recovered clock signal presented at the output 154 is generally selected in response to the select signal [0:n]. The VCO cycle counter 142 also comprises a number of outputs 160a–160n that are generally presented to the number of inputs 162a–162n of the over/under detector 144. The VCO cycle counter 142 also comprises an input 164 that generally receives a signal from the output 172 of the reference clock divider 146. The output 172 may also be presented to an input 166 of the over/under detector circuit 144, an input 168 of the reference clock divider circuit 148 and to the inputs 114a–114n of the storage elements 110a–110n. The VCO cycle counter circuit 142 functions in a similar fashion to the VCO cycle counter 58 described in connection with FIG. 4. More specifically, the over/under detector circuit 144 presents an indication signal at an output 169 when the signal received at the input 156 is out of tolerance.

The VCO cycle counter circuit 142 may be implemented as a two part counter. A first part of the counter may be implemented for the low order bits that provides a high speed synchronous operation that may match the frequency of operation of the oscillators in the VCO selector 140. A second part of the counter may be implemented as a low speed ripple counter for the high order bits since high speed decoding is not generally required for the high order bits. The ideal value indicating, a lock signal, and the values for the MIN and MAX signals may be adjusted accordingly to meet the design criteria of a particular application. For example, to have a closer tolerance than the 0.3% described in connection with FIG. 4, the ideal value may be set at 0002, the MIN value may be set at 0000 and the MAX value may be set at 0004. This would generally require an approximate 0.2% accuracy without indicating an out-of-lock condition. By implementing the counter 142 with a down counter, the counter can more easily decode smaller values (e.g., 0000, 0003 and 0006). However other values may be implemented accordingly to meet the design criteria of a particular application.

The divider circuit 146 generally provides a least significant bit (LSB) division of the external reference clock received at an input 170. The reference clock divider 146 may present the divided clock signal to the inputs 114a–114n of the storage elements 110a–110n. The divider circuit 148 generally provides a most significant bit (MSB) division of a signal received at an input 168. The divider circuit 148 generally presents the select signal [0:n] that is presented to the inputs 112a–112n of the storage elements 110–110n as well as to the input 152 of the VCO selector 140. The divider circuit 148 can generally be forced to alter its sequence of outputs [0:n] (e.g., force ULC) by the signal that is presented at the input 176.

The circuit 100 may be capable of managing and controlling a number of PLLs with the implementation of a single counter/selector section 106. Each of the PLLs 120a–120n generally includes a phase detector (PD) a filter, a voltage controlled oscillator (VCO). A phase frequency detector (PFD) and a voltage controlled oscillator (vCO) divider as well as additional circuitry that may be necessary to perform the functions of a PLL.

Each of the storage elements 110a–110n generally receive common clock signals at the inputs 114a–114n and the indication signal from the output 169 of the over/under detector 140 at the inputs 116a–116n. As a result, the counter/selector section 106 may control a number of PLLs 120a–120n with a single counter/selector section 106. The select signal [0:n] may be a multi-bit signal presented from the divider circuit 148 that may control particular operation of the individual PLLs 120a–120n.

During a condition when the VCO cycle counter 142 is being reset and the output of the reference clock divider circuit 146 is high, the next VCO output (i.e., the outputs 130a–130n) may be selected. When the output of the reference divider circuit 146 is low, the VCO counter 142 generally continues to count in a conventional fashion. When the output of the reference clock divider circuit 146 transitions high, the selected output of the storage elements 110a–110n may present a signal to the inputs 124a–124n indicating the PLLs 120a–120n should use the local clock present at the inputs 126a–126n. After the VCO counter is reset, the next VCO output may be selected. Certain design criteria may require a delay prior to the transition of the next VCO output.

The reference clock divider circuit 148 generally provides an additional divider that may be used to present the select signal [0:n] that may be used to select between the PLLs 120a–120n. The reference clock divider circuit 148 also provides an implementation for presenting the use local clock (ULC) signal to the storage elements 110a–110n. The reference clock divider circuit 148 may be implemented as a divider circuit that may be decoded to provide the required select and timing functions.

A reset of the storage elements 110a–110n may be implemented in a number of implementations, such as part of the select signal [0:n]. Specifically, if one of the storage elements 110a–110n is selected, and all the other storage elements 110a–110n are reset, the select signal [0:n] generally resets the selected storage elements 110a–110n after a predetermined number of cycles of the reference clock. Additionally, a separate select and reset signal (not shown) may be implemented to provide select and reset functions directly to the storage elements 110a–110n. The storage elements 110a–110n may be expanded to provide a state machine (possibly by adding an additional one or more memory elements) Such a state machine (not shown) may be implemented to generate the out-of-lock functions based on the reference clock signal and the output of the dividers.

A force ULC input may be added to the previously described range control logic to allow the user to force all clock recovery PLLs to be locked to the reference clock at the same time. This lock would generally occur if a particular PLL is outside of the desired operating range. The force ULC signal may be used to force each of the storage elements 110a–110n to be selected at the same time, which may make any single error reset each of the paths (i.e., each of the PLLs 120a–120n). The force ULC signal may also be used to force each of the storage elements 110a–110n to be selected at one time until a particular out-of-lock signal has been generated (or until a predetermined number of errors are generated). After the initial selection, the circuit 100 may revert to a single channel control (i.e., controlling each of the PLLs 120a–120n separately). The force ULC signal may also be used to override the inputs of one or more of the storage elements 110a–110n to force an unconditional lock to the local clock condition until the force signal is removed.

While the invention has been particularly shown and described with reference to the preferred embodiments thereof, it will be understood by those skilled in the art that various changes in form and details may be made without departing from the spirit and scope of the invention. For example, the reference period (e.g., the signal REFDIVOUT) may be generated from an external source such as a precision time generator. The external source may or may not have to be related to the reference frequency used to center the VCO. The duty cycle may be modified accordingly to meet design criteria of a particular application. For example, the counter may be modified to add one sleep cycle after each complete count cycle. The particular resolution of the VCO cycle counter 142 may be increased or decreased to provide the needed resolution. The storage elements 110a–110n may be implemented to not depend directly as a function of the reference clock. For example, the VCO may be re-centered within 64–256 clock cycles prior to tracking data. Termination of the re-centering period may be generated from an external logic source not related to the reference clock signal. Additional outputs from the divider circuits 146 and 148 may be used to drive additional storage elements 110a–110n that may provide increased granularity beyond a particular range limit (e.g., +/– three cycles). For example, counter trip points may be setup at a +/–20 cycle increment to indicate that the loop should change its tracking rate to acquire the proper frequency at a faster rate.

I claim:

1. A circuit comprising:
   a plurality of phase locked loop circuits each configured to present a recovered data signal and a recovered clock signal in response to (i) one of a plurality of serial data streams, (ii) an input clock signal, and (iii) one of a plurality of indication signals;
   a control circuit configured to present a counter signal in response to a ratio of each of said recovered clock signals to said input clock signal; and
   a plurality of storage elements each configured to present one of said plurality of indication signals in response to (i) said input clock signal and (ii) a select signal and (iii) said counter signal.

2. The circuit according to claim 1, wherein said input clock signal comprises an external reference clock signal.

3. The circuit according to claim 1, wherein said plurality of indication signals each comprise an out-of-lock signal.

4. The circuit according to claim 1, wherein said control circuit further comprises:
   a selector circuit configured to present said counter signal from one of said recovered clock signals in response to said select signal.

5. The circuit according to claim 4, wherein said control circuit further comprises:
   a counter circuit configured to present an error signal in response to (i) said counter signal and (ii) said input clock signal.

6. The circuit according to claim 5, wherein said control circuit further comprises:
   a detector circuit configured to present said counter signal in response to (i) said error signal and (ii) said input clock signal.

7. The circuit according to claim 1, wherein said control circuit further comprises a divider circuit configured to present said select signal in response to said input clock signal.

8. The circuit according to claim 7, wherein said divider circuit is configured to present said select signal in further response to an external indication signal.

9. A circuit comprising:
   a plurality of phase locked loop circuits each configured to present a recovered data signal and a recovered clock signal in response to (i) one of a plurality of serial data streams, (ii) a clock signal, and (iii) one of a plurality of indication signals;
   means for generating a counter signal in response to a ratio of each of said recovered clock signals to said input clock signal; and
   means for generating one of said plurality of indication signals in response to (i) said clock signal and (ii) a select signal and (iii) said counter signal.

10. A method for limiting the frequency of operation of a circuit, comprising the steps of:
    (a) generating a recovered data signal and a recovered clock signal in response to (i) one of a plurality of serial data streams, (ii) an input clock signal, and (iii) one of a plurality of indications signals;
    (b) generating a counter signal in response to a ratio of each of said recovered clock signals to said input clock signal; and
    (c) generating each of said plurality of indication signals in response to (i) said input clock signal and (ii) a select signal and (iii) said counter signal.

11. The method according to claim 10, wherein said input clock signal comprises an external reference clock signal.

12. The method according to claim 10, wherein said plurality of indication signals each comprise an out-of-lock signal.

13. The method according to claim 10, wherein step (b) further comprises the step of:
    (b-1) generating said counter signal from one of said recovered clock signals in response to said control signal.

14. The method according to claim 13, wherein step (b) further comprises the step of:
    (b-2) generating an error signal in response to (i) said counter signal and (ii) said input clock signal.

15. The method according to claim 14, wherein step (b) further comprises the step of:
    (b-3) generating said counter signal in response to (i) said error signal and (ii) said input clock signal.

16. The method according to claim 10, wherein step (b) further comprises the step of:
    (b-4) dividing said input clock signal to generate said select signal.

17. The method according to claim 16, wherein step (b) further comprises the step of:
    (b-5) generating said select signal in further response to an external indication signal.

* * * * *